(12) United States Patent
Hinterberger et al.

(10) Patent No.: US 10,340,494 B2
(45) Date of Patent: Jul. 2, 2019

(54) ELECTRICAL BUS BAR COMPRISING A SENSOR UNIT

(71) Applicant: AUDI AG, Ingolstadt (DE)

(72) Inventors: Michael Hinterberger, Großmehring (DE); Berthold Hellenthal, Schwanstetten (DE)

(73) Assignee: AUDI AG, Ingolstadt (DE)

(*) Notice: Subject to any disclaimer, the term of this patent is extended or adjusted under 35 U.S.C. 154(b) by 66 days.

(21) Appl. No.: 15/549,508

(22) PCT Filed: Feb. 15, 2016

(86) PCT No.: PCT/EP2016/053152
§ 371 (c)(1),
(2) Date: Aug. 8, 2017

(87) PCT Pub. No.: WO2016/131764
PCT Pub. Date: Aug. 25, 2016

(65) Prior Publication Data
US 2018/0026251 A1    Jan. 25, 2018

(30) Foreign Application Priority Data

Feb. 18, 2015 (DE) .......................... 10 2015 002 061

(51) Int. Cl.
*H01M 2/20* (2006.01)
*G01R 31/364* (2019.01)
(Continued)

(52) U.S. Cl.
CPC ............. *H01M 2/206* (2013.01); *B60L 50/64* (2019.02); *B60L 53/60* (2019.02); *B60L 58/10* (2019.02);
(Continued)

(58) Field of Classification Search
CPC ........................... H01M 2/1077; H01M 2/206
See application file for complete search history.

(56) References Cited

U.S. PATENT DOCUMENTS

| 6,304,062 | B1 | 10/2001 | Batson |
| 2012/0286739 | A1 | 11/2012 | O'Brien, Jr. |
| 2015/0171488 | A1* | 6/2015 | Hatta ................... H01M 2/204 374/152 |

FOREIGN PATENT DOCUMENTS

| DE | 10 2011 086 612 A1 | 5/2013 |
| DE | 10 2011 088 440 A1 | 6/2013 |

(Continued)

OTHER PUBLICATIONS

Korean Office Action dated Sep. 6, 2018, in connection with corresponding KR Application No. 10-2017-7026264 (10 pgs., including machine-generated English translation).

(Continued)

*Primary Examiner* — Olatunji A Godo
(74) *Attorney, Agent, or Firm* — Maier & Maier, PLLC

(57) ABSTRACT

An electrical bus bar for conveying an electric current from a first electrical device to a second electrical device, with a base body, which is formed from an electrically conductive material, and which has a first terminal for connection to the first electrical device and a second terminal for connection to the second electrical device. A sensor unit with a fastening surface has at least one sensor element for detecting or recording a physical parameter of the bus bar. The base body has a support surface, to which the sensor unit is fastened by its fastening surface.

9 Claims, 5 Drawing Sheets

(51) Int. Cl.
   *H01M 10/48*   (2006.01)
   *B60L 53/60*   (2019.01)
   *B60L 58/10*   (2019.01)
   *B60L 50/64*   (2019.01)
   *H01M 10/42*   (2006.01)

(52) U.S. Cl.
   CPC ........ *G01R 31/364* (2019.01); *H01M 10/482* (2013.01); *H01M 10/486* (2013.01); *H01M 2010/4278* (2013.01); *H01M 2220/20* (2013.01); *Y02T 10/7005* (2013.01); *Y02T 10/705* (2013.01); *Y02T 10/7072* (2013.01); *Y02T 90/121* (2013.01); *Y02T 90/128* (2013.01); *Y02T 90/14* (2013.01); *Y02T 90/163* (2013.01)

(56) References Cited

FOREIGN PATENT DOCUMENTS

| | | |
|---|---|---|
| DE | 10 2012 100 862 A1 | 8/2013 |
| EP | 2381264 A1 | 10/2011 |
| EP | 2570816 A2 | 3/2013 |
| JP | 2010-164517 A | 7/2010 |
| KR | 20120006309 A1 | 1/2012 |
| WO | 199400888 A1 | 1/1994 |
| WO | WO2014010419 * | 1/2014 |

OTHER PUBLICATIONS

Notification of Transmittal of Translation of the International Preliminary Report on Patentability dated Sep. 14 2017, in connection with corresponding international application No. PCT/EP2016/053152 (12 pages).

Examination Report dated Nov. 30, 2015 of corresponding German application No. 10 2015 002 061.7; 6 pgs.

International Search Report dated Jul. 26, 2016 of corresponding International application No. PCT/EP2016/053152; 20 pgs.

\* cited by examiner

ELECTRICAL BUS BAR COMPRISING A SENSOR UNIT

FIELD

The present invention relates to an electrical bus bar for conveying an electric current from a first electrical device to a second electrical device, with a base body formed from an electrically conductive material, which has a first terminal for connection to the first electrical device and a second terminal for connection to the second electrical device. The invention further relates to a battery with at least two battery cells, wherein each of the battery cells has two electrodes, which interact electrochemically with each other, wherein each of the electrodes has a terminal contact, wherein at least one terminal contact of one of the battery cells is connected in an electrically conductive manner to a terminal contact of the other of the battery cells by means of an electrical bus bar, wherein the electrical bus bar has a base body formed from an electrically conductive material. Finally, the invention also relates to a motor vehicle with an electrical system, which has a battery, and with an electric drive device connected to the electrical system, wherein the battery and the drive device each have at least two electric terminal contacts, wherein one of the terminal contacts of the battery and one of the terminal contacts of the drive device are connected to each other in an electrically conductive manner by means of an electrical bus bar, wherein the electrical bus bar has a base body formed from an electrically conductive material.

BACKGROUND

Bus bars of the generic type are known in basic principle, so that a separate documentation of publications for this is not needed. Bus bars, often also referred to as collecting bars, are components in the electrical energy supply and serve for conveying electrical energy due to a current flow from the first electrical device to the second electrical device or vice versa. Electrical devices can be, for example, electrical consumer devices, in which the supplied electrical energy is utilized for implementation of an intended function, as well as energy sources, such as, for example, electrical generators based on electric machines, optoelectric converters, such as, for example, solar cells or the like, fuel cells, and/or the like. Bus bars have, besides a high electrical conductivity, an appropriate mechanical strength, so that the influence of mechanical forces, such as those that can occur, for example, in the case of overcurrents, can be conveyed by the bus bar, without the intended function thereof being substantially impaired. Beyond this, bus bars can often withstand high thermal loads, so that, in thermally exposed areas, they can also execute their intended function substantially in a reliable manner. The bus bar generally has a base body made of an electrically conductive material, which provides terminals for the electrical devices, such as the first electrical device and the second electrical device. Used as material is often a metal such as aluminum, copper, alloys thereof with, if need be, other metals, and/or the like. Moreover, bus bars are components in electrical engineering that are relevant to safety, for which reason they are included in, among other things, standards specifications, such as, for example, in DIN 43671, DIN 43673, DIN 43771, and others. However, bus bars find use not only in stationary energy distribution, but also, beyond this, in electrical systems of motor vehicles as well as in other electrical devices in which electrical energy is distributed, particularly on a large scale.

Thus, for example, the utilization of bus bars is also common in the case of batteries that comprise at least two battery cells. A battery cell is a device that has two electrodes that interact electrochemically with each other. The interaction can occur under supplemental assisting action of an electrolyte. Battery cells, which are also referred to as galvanic cells, are preferably reversible in terms of their function, such as occurs, for example, when batteries in the form of rechargeable batteries or the like are employed. On account of the electrochemical interaction of the electrodes, a direct current voltage that is specific for the particular battery cell chemistry is created and is supplied to the terminal contacts of the respective battery cell that are connected to the electrodes. This direct current voltage is generally relatively low. Many applications in electrical engineering necessitate a direct current voltage that markedly exceeds the direct current voltage that can be supplied by a single battery cell. For this reason, a plurality of battery cells are often combined to form a battery and electrically connected within the battery in accordance with the electrical requirements, for example in the form of a serial connection, a parallel connection, combinations thereof, or the like.

Within the battery, the individual battery cells are therefore connected in an electrically conductive manner by means of bus bars in the desired kind of circuit in order to be able to supply the desired direct current voltage to the terminal poles of the battery. Such batteries are employed, for example, as lead acid batteries in the motor vehicle sector, as nickel cadmium batteries in the aircraft sector, and, for interruption-free supply of current, as lithium ion batteries in the sector of small household appliances and/or the like, but also recently for electrically driven motor vehicles.

Motor vehicles of the generic type are also well known. Preferably, motor vehicles comprise those that have an electrical system with a battery as well as a drive device connected to the electrical system. Such motor vehicles are, for example, electric vehicles, hybrid vehicles, in which a drive operation is possible both by means of an electric drive device and by means of a combustion engine, or the like. In these motor vehicles, the battery and the drive device each have at least two electric terminal contacts. For the purpose of electric coupling, at least one of the terminal contacts of the battery and one of the terminal contacts of the drive device are connected to each other in an electrically conductive manner by means of an electrical bus bar. In this case, too, the electrical bus bar is formed by an electrically conductive base body.

Even though the prior art has proven itself, there are nonetheless problems, in particular for use in motor vehicles. Thus, a common practice is to detect or record the current that is applied to a bus bar by means of a current transformer unit. The current transformer unit is an electrical component that, by means of a magnetically permeable annular core, records the magnetic field produced by a current flowing through the bus bar and provides a corresponding measurement signal. Such a current transformer unit generally has a relatively heavy weight as well as also a large structural form. This poses an obstacle and is undesired especially in the field of electromobility. Moreover, the large structural form and the heavy weight lead to problems, especially in the field of electromobility in regard to exposure to vibrations and impacts, such as those usually occurring during the intended operation of motor vehicles.

Alternatively, it is known to record the current flow through the bus bar by means of a shunt. For this purpose, the bus bar is divided into two base bodies, which are connected to each other in an electrically conductive manner by means of the shunt. Although it is possible in this way to obviate the aforementioned complicated current transformer unit and the problems caused by it, this embodiment, however, has proven detrimental insofar as the shunt must be engaged in the bus bar, the consequence of which is not only a great effort, but, beyond this, is also undesired on account of the high current load placed on the bus bar in intended operation. The required contacting points in the area of the shunt result in additional problems in terms of safety and reliability.

SUMMARY OF THE DISCLOSURE

The invention is therefore based on the object of further developing a bus bar, a battery, as well as a motor vehicle, to the effect that the recording of a state parameter of the bus bar, such as, for example, the current, is improved.

It is proposed by the invention that, in particular, the bus bar has a sensor unit with a fastening surface, which has at least one sensor element for detecting or recording a physical parameter of the bus bar, wherein the base body has a support surface, at which the sensor unit is fastened by with its fastening surface.

Preferably, the fastening surface and/or the support surface are planar or flat in design. It has proven to be especially advantageous when both the fastening surface and the support surface are flat in design. In terms of this disclosure, flat means that the surface that is planar in design is not curved. This therefore means a surface that can be spanned in space essentially by two non-parallel straight lines. In basic principle, however, the fastening surface and the support surface can also be designed to be at least in part curved or angled. In this case, they are preferably designed to correspond to each other at least in terms of their contour, so that it is possible to achieve a fastening over the largest possible surface area.

It is possible by means of the invention, for the first time, to integrate the sensor unit completely into the bus bar. Therefore, it is no longer necessary—in contrast to the prior art—to provide complicated measuring units in the area of the bus bar, such as the current transformer unit or the like and, in accordance with the invention, it is also no longer necessary to engage in the structure of the base body in order to make possible a measurement of the parameter of the bus bar.

The sensor unit can serve for the detecting or recording of one or a plurality of physical state variables of the bus bar, such as, for example, the recording of an electric current that flows through the bus bar, of an electric potential, of a temperature, of a mechanical expansion, of a mechanical bending, and/or the like.

It has proven to be especially advantageous when the fastening surface of the sensor unit is designed to be smaller than the support surface of the bus bar. In this case, the sensor unit can be arranged completely on the bus bar, so that it does not extend substantially beyond the outer dimensions in a plane of the support surface. Preferably, the sensor unit is joined closely, in particular directly, to the support surface. The fastening can, for example, occur in a material-bonded manner by means of welding or the like. Beyond this, it can be provided that the sensor unit is joined to the bus bar by means of adhesive attachment or the like. Finally, there also exists the possibility of joining the sensor unit to the bus bar mechanically by means of a clip, or the like. Of course, these fastening possibilities can also be combined with one another.

Preferably provided at the same time in the area of the fastening surface is also a sensor element for the physical parameter of the bus bar that is to be recorded. It has proven especially advantageous when the sensor element is designed for recording a temperature, an expansion, a bending, and/or the like. In this case, a preferably direct contact between the sensor element and the bus bar is advantageous for the accuracy of the recording.

Moreover, the bus bar can be designed rigidly in the area of the support surface, so that mechanical effects cannot substantially impair the fastening of the sensor unit at the support surface. Of course, for recording a particular physical parameter of the bus bar, it is also possible to provide a detachable fastening of the sensor unit to the bus bar. This has proven to be advantageous, in particular, when, for example, the sensor unit shall be replaced on account of damage or also when the sensor unit is to be retrofitted to a bus bar of an existing electrical system.

The support surface can be formed by a surface of the bus bar, such as, for example, in the case of a bus bar with a rectangular cross section, by one of the two large surfaces in the longitudinal direction of the bus bar. Moreover, it can be provided that the bus bar has a recess, which provides the support surface. This proves especially advantageous in the case of bus bars in which the cross-sectional area departs from a rectangular shape. Beyond this, it can be provided, of course, that the sensor unit is arranged depressed in the bus bar. Preferably, it is arranged completely in the bus bar, so that its dimensions do not protrude over the outer dimensions of the bus bar.

It is achieved overall by means of the invention that a bus bar, in particular a collecting bar, can be provided integrally with the sensor unit. In consequence thereof, the electrical bus bar of the invention is constructed preferably in one piece with the sensor unit and can be handled separately as a structural unit. In particular, it is possible to check the bus bar or the collecting bar together with the sensor unit in regard to the intended operation thereof and, in this way, to be able to supply prechecked structural units for further processing.

The sensor unit has a sensor element for recording the physical parameter of the bus bar. The sensor element is constructed so as to be adapted to the physical parameter to be recorded. For example, the sensor element can contact the bus bar directly in order to record the temperature thereof. It can also be provided that the sensor element contacts the bus bar directly to determine, for example, an expansion and/or a bending of the bus bar. Moreover, the sensor element can also be arranged in a contact-free manner with respect to the bus bar for recording, for example the electric current that flows through the bus bar.

In accordance with an enhancement, it is proposed that the sensor unit is designed to record the electric current flowing through the electrical bus bar. Accordingly, the sensor element of the sensor unit is designed for wireless recording of an electric current. For example, this can occur on the basis of a fluxgate technology or the like. In the process, it can be advantageously provided that a magnetic field strength is recorded by means of the sensor element. In particular, taking into consideration the geometric characteristics of the bus bar, it is then possible to determine the corresponding current that actually flows through the bus bar. For example, it can be provided that, by means of the sensor element, a local current density in the region of the sensor element is recorded. It is then possible on the basis of this current density, taking into consideration a cross-sectional area of the bus bar, to determine the total current that flows through the bus bar. In the present case, it is provided that the sensor unit produces locally in its region a magnetic field opposing the electric current flowing through the base body until the locally acting field is compensated for. The sensor unit alters the opposing field until the determined field strength is essentially zero. It is then possible to determine from the value for generation of the opposing field the value of the electric current actually flowing through the base body. This can be conducted by calculation and/or by taking into consideration an allocation table, which is available, for example, in the form of data, in particular a data file.

It has proven to be especially advantageous when the sensor unit is formed together with the sensor unit, in particular, in one piece as a structural unit, which can be joined to the bus bar preferably in one piece. Moreover, it can be provided that the sensor unit, preferably including the sensor element, is designed as a semiconductor chip or the like. In this way, it is possible to achieve an especially high integration and reliability during the intended operation.

In accordance with another advantageous embodiment, it is proposed that the sensor unit is arranged electrically insulated with respect to the base body. This enables the sensor unit to be designed very flexibly in regard to its electrical construction. Therefore, in designing the sensor unit, it is not necessary to take into account the layout of electrical conductors of the sensor unit in relation to implementation of its intended function. For example, the electrical insulation can be provided directly at the sensor unit itself and, namely, at the fastening surface thereof. If the sensor unit is a semiconductor chip, it can be provided that the insulation is formed by an oxide layer in the area of the fastening surface of the sensor unit. This permits the formation of the electrical insulation so as to enable the electrically insulated arrangement of the sensor unit in one piece with the sensor unit. Moreover, this electric insulation can be realized in a very simple manner and constructed to be very thin in the case of a suitable oxide layer, so that a very compact electrical bus bar can be achieved. A separate component for the insulation can thereby be spared.

Preferably, it is provided that geometric dimensions of the sensor unit do not exceed corresponding geometric dimensions of the electrical bus bar. This makes it possible to arrange the sensor unit depressed, preferably completely, in a recess in the electrical bus bar. In particular, it is thereby possible to ensure that the geometric dimensions of the bus bar are not altered substantially by the arrangement of the sensor unit. It is thereby possible to achieve a very compact electrical bus bar.

In accordance with an enhancement, it is proposed that the sensor unit is electrically connected to a first supply terminal at the base body for supplying electrical energy for its intended operation. In this way, the arrangement of the sensor unit at the electrical bus bar can also be utilized at the same time for its energy supply. A second supply terminal, for example, can be connected to one of the electrical devices, preferably to a terminal that is not electrically connected to the electrical bus bar. As a result of this, it is possible to provide, between the first and the second supply terminals, an electric voltage for supply of the sensor unit.

In accordance with another embodiment, it is proposed that the sensor unit is designed for the wireless supply of electrical energy for the intended operation thereof. For example, it can be provided that the sensor unit is designed as a transponder, which, for carrying out a desired recording, is supplied with energy separately by means of an energy field for the purpose of electrical energy supply of the sensor unit for its intended purpose. For example, the energy field can be an alternating magnetic field, an alternating electromagnetic field, and/or the like. It can be provided that the energy field is available solely for the period of time in which the recording of the desired physical parameter is carried out and transmitted to a central unit. This embodiment has proven to be advantageous in regard to the ease of installation and, in particular, the ease of retrofitting, because wirings such as those required in sensor units of the prior art can largely be dispensed with. Beyond this, it can be provided that the sensor unit comprises a battery, which supplies it with electrical energy preferably for its entire intended lifetime. Such a battery can be, for example, a lithium battery or the like. Of course, the aforementioned embodiments can also be combined with one another.

Another embodiment of the invention proposes that the sensor unit is designed for establishing a wireless communications link and/or a communications link via the bus bar to a central unit. The communications link preferably serves for transmitting the recorded physical parameter of the sensor unit to the central unit, which processes the physical parameter for further purposes. The central unit can be, for example, a central control unit, in particular, in the case of a motor vehicle, a central control unit of the motor vehicle. The wireless communications link can be, for example, radio-based, infrared-based, ultrasound-based, and/or the like. Moreover, the communications link can also be realized, of course, via the bus bar, with the central unit likewise having a possible corresponding terminal at the bus bar as a communications link. For this purpose, the sensor unit can emit a corresponding sensor signal to the bus bar, which can be received by the central unit. For example, it can be provided to this end that a modulated signal is emitted to the bus bar, said signal containing information or data in regard to the recorded physical parameter. For this purpose, the sensor unit can have an emitter unit, by means of which the sensor signal can be emitted either wirelessly or else through a conductor to the bus bar. Beyond this, it can be provided that the sensor unit has a receiver unit, by means of which it can receive data or information from the central unit or from other devices. As a result of this, it is possible to control the sensor unit and/or to make adjustments with respect to the sensor element and/or to analyze a signal of the sensor element. Further functions that may be realized in this way are, for example, a function test that can be triggered, data reconciliation, and/or the like.

In accordance with an enhancement of the invention, the sensor unit and the communications device each have an energy converting device, which is designed for providing energy for the energy supply of the sensor unit from a received signal. Referred to as signals are physical quantities in which one or a plurality of parameters carries or carry information. The energy converting devices are therefore designed for utilizing the physical quantities of the received signal for the energy supply of the sensor unit. To this end, the energy converting device is designed, in particular, to convert a non-electrical physical quantity into an electrical quantity. This is also referred to as energy harvesting. In the present case, this means that, via the signal paths, not only information but also energy for the energy supply is transmitted in an advantageous way.

For an electrical signal that has, as a physical quantity, a current intensity or a voltage, for example, and in which the information is transmitted in a frequency or a phase, for example, the energy converting devices are preferably designed so as to supply the current intensity or the voltage of the received signal of the sensor unit for the energy supply. In the case of an optical signal, which has light waves as the physical quantity, the energy converting devices, constructed as solar sensors, are designed so as to convert the light waves into electrical energy for the supply of the network nodes. In the case of a signal in which information is transmitted inductively to the sensor unit by means of RFID (radio-frequency identification), the magnetic wave can, for example, be converted by means of an energy converting device constructed as a receiver coil to an electric voltage for supply of the sensor unit.

Energy harvesting refers to obtaining small quantities of electrical energy from sources such as ambient temperature, vibrations, or air flows. The employed energy harvesting structures are also referred to as nanogenerators. Energy harvesting avoids the limitations in wireless technologies due to wired current supply or due to special or separate batteries.

Such nanogenerators can be, for example, piezoelectric crystals, which, when subjected to a force, such as, for example, due to pressure, vibration, or sound, produce an electric voltage, and/or thermoelectric generators, and pyroelectric crystals, which obtain electrical energy from temperature differences, and/or antennas, in particular passive RFIDs, which capture energy from radio waves or electromagnetic radiation and use it for the energy supply, and/or sensors, which convert light into electrical energy based on the photoelectric effect.

In accordance with another embodiment, it is proposed that the base body between the first and the second terminal has a spring-elastic area. This makes it possible, in particular in the case of an otherwise rigid base body, to record mechanical influences on the bus bar by means of sensor elements adapted for this purpose. Thus, it is possible, for example, to determine changes in mechanical dimensions in order to be able thereby to determine further physical parameters of the bus bar, in particular mechanical parameters. Such parameters can be, for example, the length of the bus bar, the width of the bus bar, its geometric shape, and/or the like. Moreover, it is possible to provide a tolerance compensation element, which, for example, can form the spring-elastic area. The tolerance compensation element can comprise an electrically conductive braid, for example. It can be provided that the changes thereof can be recorded.

It has proven to be especially advantageous when the sensor unit is designed to record a mechanical stress at the base body. This can be utilized for determining, in particular, loads in the region of the first and second terminals of the first electrical device and the second electrical device. As a result, it is possible early on to detect states of mechanical overload, which can occur in the region of the terminals of the electrical devices, so as to initiate countermeasures. Damage in the region of the terminals on account of mechanical overloads can thereby be reduced.

BRIEF DESCRIPTION OF THE DRAWINGS

Further advantages and features ensue on the basis of the following description of exemplary embodiments taking into consideration the appended figures. In the figures, identical reference numbers refer to identical features and functions.

Shown are.

DETAILED DESCRIPTION OF THE DRAWINGS

Figure 1:
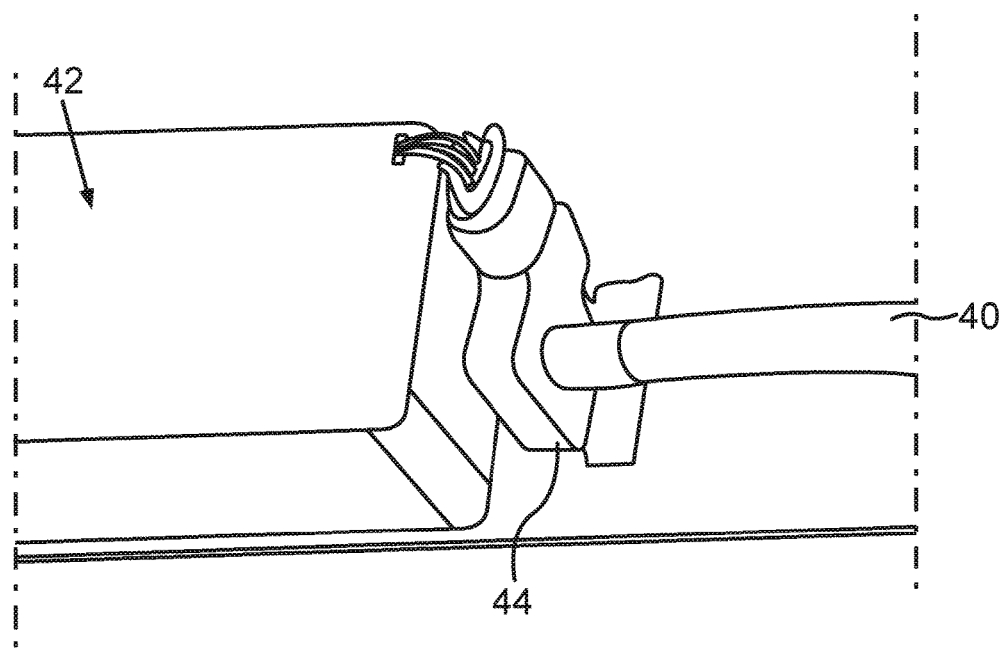
FIG. 1 in perspective schematic view, a bus bar, which is guided through a current transformer according to the prior art.

FIG. 1 shows, in a perspective schematic illustration, an excerpt of a high-voltage battery system 42 of an electrically driven motor vehicle, which is not illustrated further. A current cable 40 of the high-voltage battery system 42 serves for the electrical connection of the high-voltage battery system 42 to an electrical system of the motor vehicle, which is not illustrated in further detail. The motor vehicle is driven by means of an electric drive, which is supplied for this purpose with electrical energy by the high-voltage battery system 42. In the present case, it is further provided that the electrical energy is supplied not only for the drive device for the purpose of acceleration of the motor vehicle, but, at the same time, also takes up electrical energy during a decelerating operation, that is, stores electrical energy in the high-voltage battery system 42.

The electric conductor 40 is guided through a toroidal transformer 44, which is furnished with an electric coil in a known way in order to record the electric current that flows in the electric conductor 40. By means of an electronic analysis unit, which is not illustrated further, the signal supplied by the current transformer 44 is analyzed and the electric current flowing through the electric conductor 40 is determined. The determined value of the current is transmitted to a battery management system, which is also not illustrated further, via a communications link. In the present case, the communications link is formed by a communications bus of the motor vehicle, namely, a CAN bus, to which the electronic analysis unit is connected.

Figure 2:
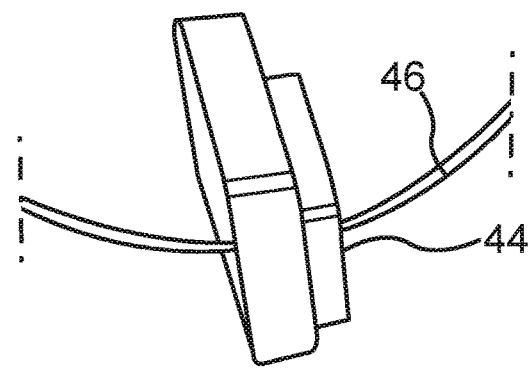
FIG. 2 a schematic perspective view of a second embodiment of a bus bar, which is guided through a current transformer according to the prior art.

FIG. 2 shows, in perspective schematic illustration, another embodiment for a current measurement of an electric conductor 46, which is designed here as a strip conductor and which is likewise guided through a current transformer 44, as already discussed in relation to FIG. 1.

Figures 3, 4:
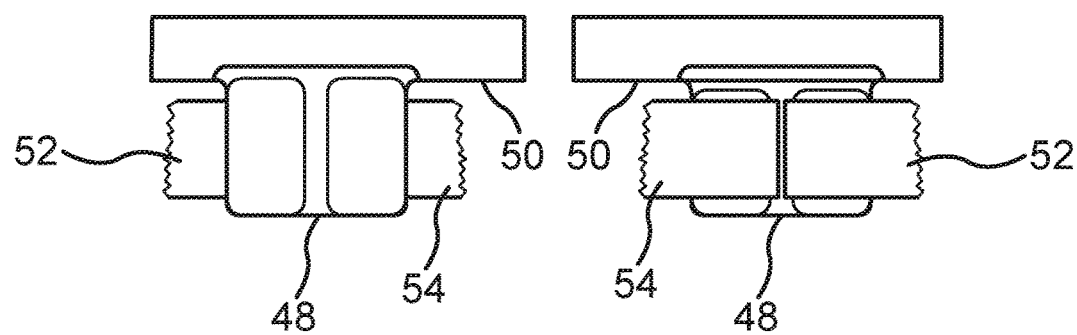
FIG. 3 a schematic perspective view of a shunt arrangement for connection with a bus bar.
FIG. 4 a schematic perspective view of the shunt arrangement according to FIG. 3 from a back view.

FIG. 3 shows an alternative embodiment of the current measurement in the prior art based on the utilization of a shunt 48. Shown in FIG. 3 is a front view in perspective illustration, whereas FIG. 4 shows the corresponding back view in a perspective illustration. In the present case, the shunt 48 is formed on a circuit board 50, which, at the same time, also has an electronic analysis unit, which is connected to the shunt 48.

The shunt 48 is connected to terminal lugs 52, 54, to which corresponding electric conductors or bus bars can be connected. In order to be able to determine the current of the electric conductor or of the bus bar, the shunt 48 needs to be connected in series to the electric conductor or to the bus bar, so that the electric current flowing through the bus bar or the electric conductor also flows, at the same time, through the shunt 48. The electric current flowing through the shunt 48 causes a voltage drop, which is recorded and analyzed by means of the electronic analysis unit arranged on the circuit board 50. The electronic analysis unit provided on the circuit board 50 transmits a corresponding current value to the battery management system, as already discussed in connection with FIG. 1.

A drawback of this design has proven to be that the shunt 48 needs to be connected in series to the corresponding bus bar or electric conductor. This requires corresponding design measures, which turn out to be very complicated in the case of high currents and high voltages. This has proven to be detrimental especially in the motor vehicle sector, where small construction volume and low weight are desired.

A drawback of the utilization of current transformers has proven to be, in particular, that, besides the large structural form required for recording the electric current, the current transformer also generally has a corresponding heavy weight. Especially in mobile utilization, in particular in the case of motor vehicles, this has proven to be detrimental, also owing to the effect of vibrations during the intended operation.

Figure 6:
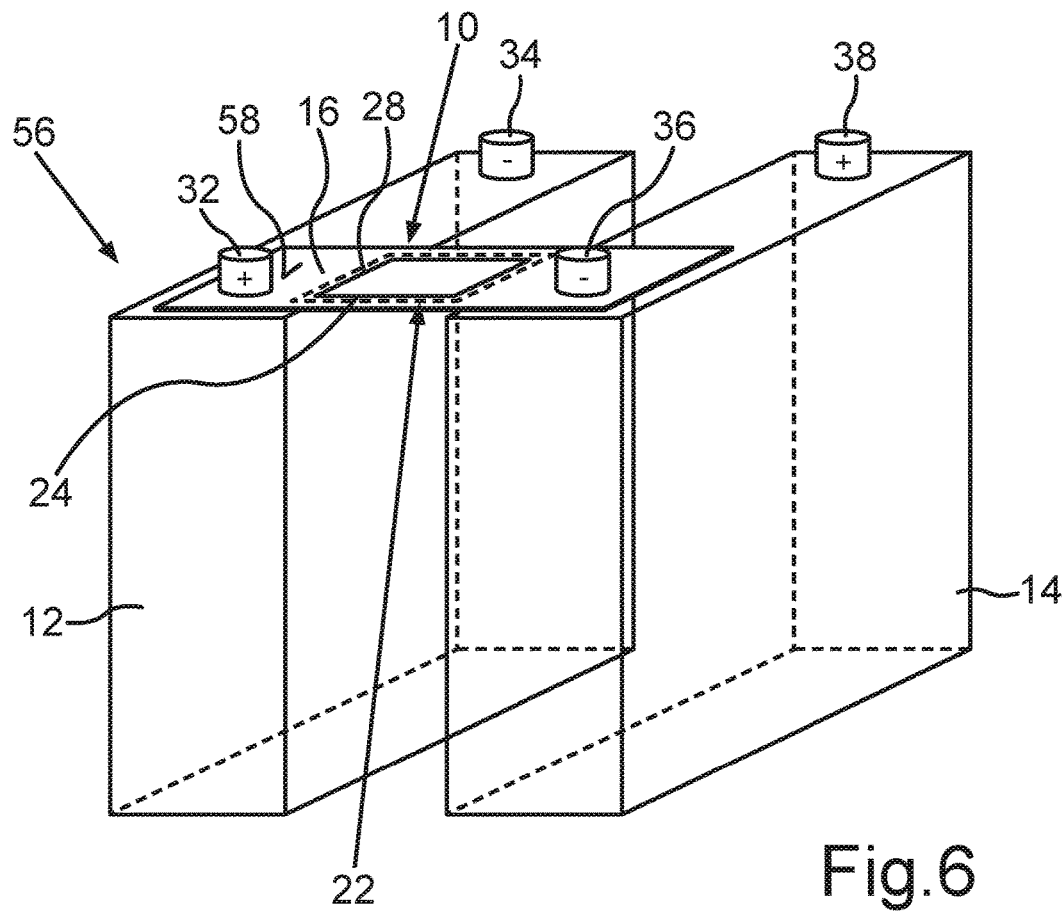
FIG. 6 in schematic perspective illustration, an excerpt of a battery with a bus bar according to the invention.

FIG. 6 shows, in a schematic perspective view, an excerpt of a high-voltage battery 56 of an electrically driven motor vehicle, which is not illustrated further, where, in FIG. 6, only two battery cells 12, 14 of the high-voltage battery 56 are illustrated. The high-voltage battery 56 can be operated reversibly, which means that it can not only deliver energy, but an also take up energy. Accordingly, what is involved in the present embodiment in the case of the high-voltage battery 56 is a rechargeable battery. Accordingly, the battery cells 12, 14 are designed as galvanic cells.

In the present case, the battery cells 12, 14 each have two electrodes, which interact electrochemically with each other. For this purpose, an electrolyte can be provided additionally and is arranged in each battery cell 12, 14 and contacts the electrodes. The basic principle of the electrochemical interaction for producing an electric voltage at the electrodes is fundamentally known, so that further discussions in this regard are dispensed with. Accordingly, the electrodes themselves are not illustrated in the figures, but rather only the terminal contacts 32, 34, 36, 38, which are connected to them in an electrically conductive manner. In the present case, the battery cell 12 has terminal contacts 32, 34, with a positive direct current voltage with respect to the terminal contact 34 being adjusted at the terminal contact 32 on account of the electrochemical interaction. Correspondingly, the battery cell 14 has terminal contacts 36, 38, with, in this case, a positive direct current voltage being created at the terminal contact 38 with respect to the terminal contact 36.

As can be seen in FIG. 6, the terminal contact 32 of the battery cell 12 and the terminal contact 36 of the battery cell 14 are electrically connected to each other via an electrical bus bar 10. The two battery cells 12, 14 are electrically connected in series by way of the bus bar 10, so that the summed voltage of the battery cells 12, 14 is applied at the terminal contacts 34 and 38.

The bus bar 10 has a base body 16, which is formed from an electrically conductive material, which is copper in the present case. The bus bar 10 has an essentially rectangular cross section for the purpose of conveying current, said cross section extending in the present case uniformly over a longitudinal extension of the bus bar 10 between the terminal contacts 32, 36 of the battery cells 12, 14.

In the present case, the base body 16 has a rectangular cross section transverse to its longitudinal extension as well as a surface 58, which provides a support surface 28. The support surface 28 has an essentially flat or planar design and is likewise rectangular in form. It is arranged between the terminal contacts 36, 38*. A sensor unit 22 is attached adhesively by its fastening surface 24 on the support surface 28. Instead of adhesive attachment or attachment by a supplemental means, it can be provided that the sensor unit 22 is fastened by means of a fastening element, which is not illustrated further—for example, a clip—at the base body 16 of the bus bar 10.

* sic; terminal contacts 32, 36?—Translator's note.

The sensor unit 22 has a sensor element 26 (FIG. 5), which, in the present case, contacts the base body 16 in the area of the support surface 28 through the adhesive layer. In the present embodiment, it is provided that, by means of the sensor element 26, a temperature of the bus bar 10 or of the base body 16 is recorded.

Figure 5:
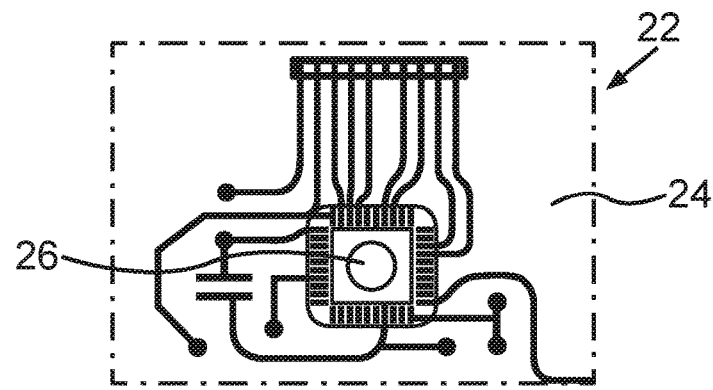
FIG. 5 a schematic plan view of a strip conductor array of a sensor unit according to the invention.

Not illustrated in FIG. 5 is an electronic analysis unit, which is soldered to corresponding terminal contacts, such as those illustrated in FIG. 5. In the present case, what is involved is an integrated circuit, which comprises, besides the terminal of the sensor element 26 also, at the same time, an electronic analysis unit as well as a communications unit. In this way, the recorded temperature value can be transmitted to the battery management system.

Figure 7:
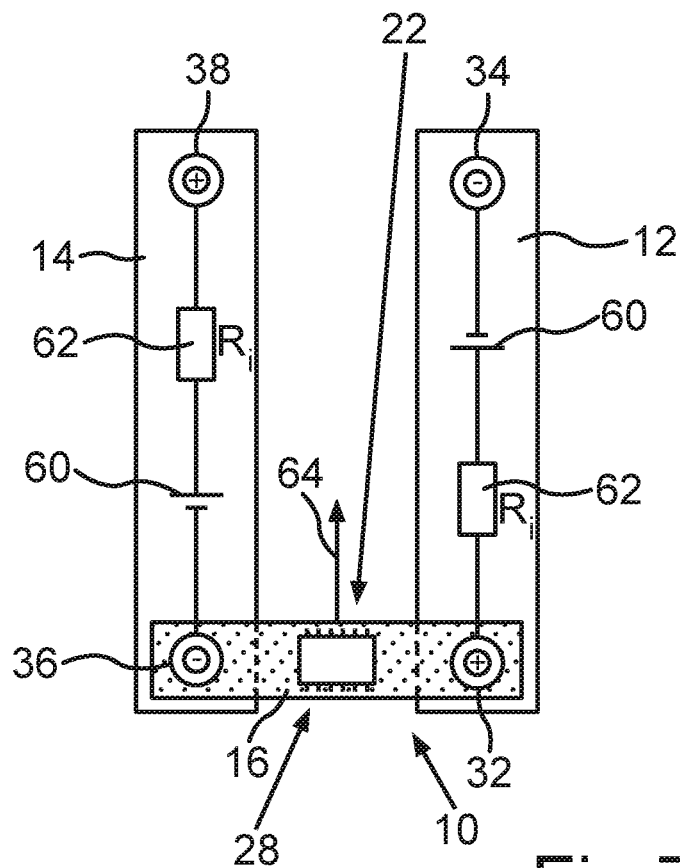
FIG. 7 a schematic circuit diagram illustration of the arrangement according to FIG. 6.

FIG. 7 shows, in a schematic circuit diagram illustration, the functional units according to FIG. 6. Seen are the terminal contacts 32, 34, 36, 38 of the battery cells 12, 14, with the terminal contacts 32, 36 being connected to each other in an electrically conductive manner via the bus bar 10. Further illustrated schematically in the battery cells 12, 14 is a cell capacitor 60 as well as an internal resistor 62. The function of the battery cells 12, 14 is described in a modeled manner with these two elements. It is further seen in FIG. 7 that the sensor unit 22 is connected to a communications link 64, by which the sensor unit 22 can transmit recorded physical parameters to the battery management system. Moreover, the sensor unit 22 can receive control commands as well as data that are required or desired for the intended operation thereof, via this communications link 64.

It is not seen directly in the figures that, in the present case, the sensor unit 22 serves not only for recording the temperature, but also that, at the same time, for recording the electric current flowing through the bus bar 10 or the base body 16. For this purpose, the sensor unit 22 has a magnetic field sensor, which is not illustrated further and which is arranged integrated in the sensor unit 22. By means of the sensor unit 22, the magnetic field intensity can be recorded, with it being possible to determine the electric current flowing through the bus bar 10 or the base body 16, taking into consideration the geometric dimensions of the base body 16 as well as other boundary conditions. This method is suited in an especially advantageous manner for current measurement, because, on the one hand, it makes possible a very precise current measurement and, on the other hand, necessitates only a small construction volume or a low weight.

Moreover, the structural form of the sensor unit 22 can be chosen in such a way that it can be arranged depressed in the base body 16. As a result of this, special geometric requirements due to spatial limitations can be taken into special account. Voluminous and heavy current transformers can thus be dispensed with. On account of the low weight and the small structural size, the sensor unit 22 according to the invention is, of course, substantially more robust in regard to mechanical loads, such as vibrations, impacts, and/or the like.

Figure 8:
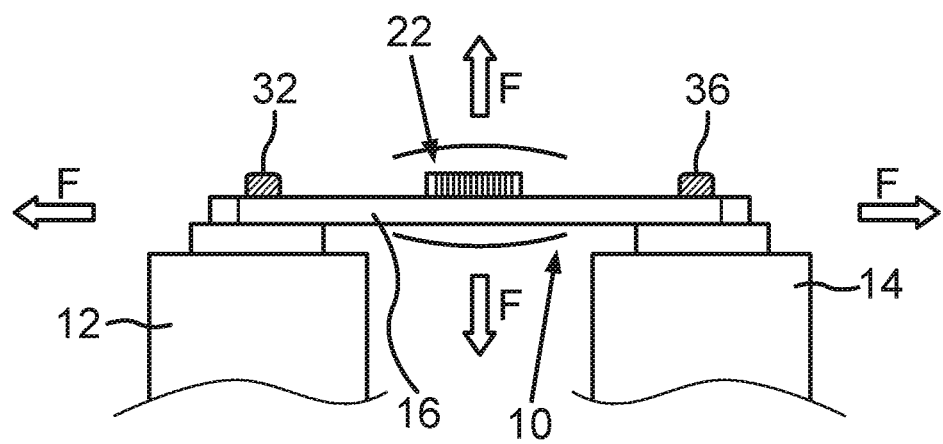
FIG. 8 a schematic illustration of an excerpt of a lateral view of the battery according to FIG. 6.

In FIG. 7, the sensor unit 22 is equipped with an integrated semiconductor circuit for highly precise current measurement and therefore with other sensors, namely, the temperature sensor, as well as also mechanical expansion or strain sensors and force sensors (FIG. 8). Although, in the present case, the communications link 64 is designed as a wired communications link, it can also be designed, moreover, as a wireless communications link based, for example, on near field, ultrasound, infrared, and/or the like. By means of the communications link 64, a communications link to the battery management system is created.

In order to be able to achieve a highly precise current measurement in relation to the bus bar 10 or the base body 16, the aforementioned integrated semiconductor circuit—for example, a current measurement based on fluxgate technology—is provided. As a result of this, it is possible to determine a voltage drop of the bus bar 10 or of the base body 16 in the intended operation or a corresponding electrical resistance. These values can also be transmitted to the battery management system.

FIG. 8 shows a further characteristic of the sensor unit 22, for which purpose an excerpt of FIG. 6 is illustrated schematically in a front view. The sensor unit 22 is furnished, namely, with a strain gauge strip (DMS) or a strain gauge strip semiconductor component, which is integrated into the integrated semiconductor circuit of the sensor unit 22. As a result of this, the mechanical load placed on the base body 16 or on the bus bar 10 can be determined in relation to a load related to expansion, bending, and force. In connection with the temperature measurement, it is thus possible to monitor movements, expansions, bends, and/or the like of the base body 16 or of the bus bar 10. This also makes it possible to monitor any load placed on the terminal contacts 32, 36 likewise in terms of mechanical and thermal stress, and, namely, also to do so over the entire lifetime of the battery 56. As a result of this, conclusions can be drawn about the aging or the quality of a joining method used, such as, for example, screw connection, laser welding, bonding, and/or the like.

Figure 9:
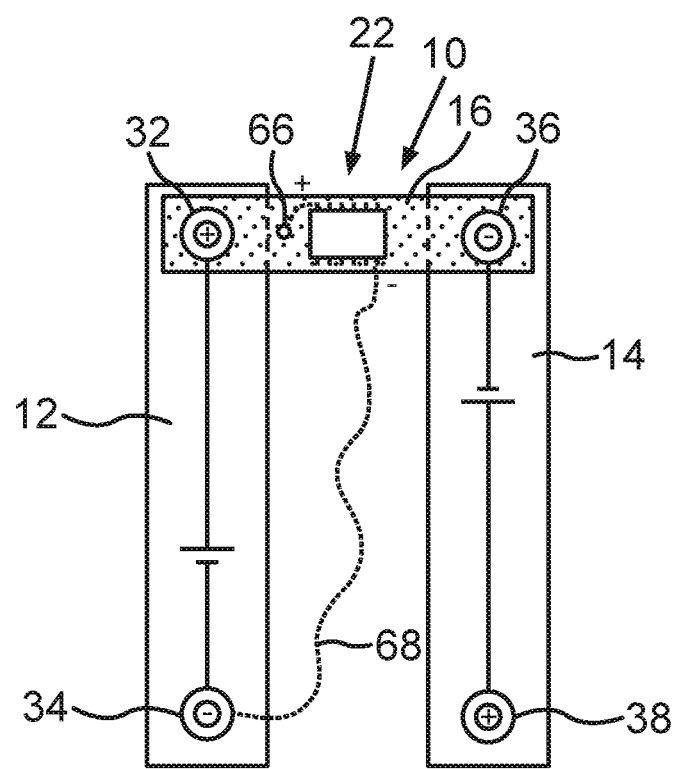
FIG. 9 a schematic circuit diagram illustration of another embodiment according to of the invention as in FIG. 7.

FIG. 9 shows, in a schematic circuit diagram illustration, an embodiment by means of which the sensor unit 22 can be supplied with electrical energy. In basic principle, the circuit is based once again on the circuit that was discussed on the basis of FIG. 7 in basic principle, for which reason reference is made, in addition, to those discussions.

In supplement to the preceding explanation of exemplary embodiments, it is provided in the present case that the sensor unit 22 is connected with a plus terminal to a junction 66 of the base body 16 in an electrically conductive manner. If the sensor unit 22 is designed as a semiconductor chip or as an integrated semiconductor circuit, the positive voltage supply potential can be tapped directly by the bus bar 10 or by the base body 16 thereof. A corresponding minus terminal of the sensor unit 22 is connected via an electrical conductor 68 to the terminal contact 34 of the battery cell 12. As a result of this, the sensor unit 22 is delivered an electric supply voltage for the purpose of enabling its intended operation.

The electrical conductor 68 can be, for example, a flexible cable or the like. Accordingly, by means of the electrical conductor 68, a negative voltage potential is supplied. In the present case, it is provided that the electrical conductor 68 is attached to the terminal contact 34 of the battery cell 12. However, for providing a higher supply voltage for the sensor unit 22, a connection terminal to another battery cell, which is connected in series to the battery cell 12 and is not illustrated further, could also be provided. This makes possible, on the one hand, a higher voltage supply for the sensor unit 22 and permits, on the other hand, a distribution of the electrical energy required for the intended operation of the sensor unit 22 over a plurality of battery cells of the battery 56. As a result of this, any non-uniform load of individual battery cells of the battery 56 could be reduced.

For the intended operation, it is appropriate, of course, that breakdown voltages or parasitic voltages cannot result from the arrangement according to the invention. For this reason, the invention provides that the sensor unit 22 is fastened in an electrically insulated manner to the support surface 28. The electrical insulation can be realized, for example, by way of the adhesive layer or else by an insulating film, an insulating washer, and/or the like. Preferably, it is provided that the energy supply of the sensor unit 22 comprises a galvanic isolation. This can be realized, for example, by means of a DC/DC transformer that comprises an isolating transformer.

Alternatively or additionally, it can be provided that the sensor unit 22 is supplied wirelessly with electrical energy via, for example, an alternating magnetic field or the like. For this purpose, the sensor unit 22 then has a receiving coil, which interacts with the energy field or with the alternating magnetic field and takes up energy from the alternating magnetic field and supplies said energy as electrical energy for the operation of the sensor unit 22.

It has proven to be especially advantageous when the sensor unit 22 is designed completely as a single integrated semiconductor chip, which can be mounted on a circuit board (FIG. 5). Overall the invention is based on the integration of measurement electronics in the bus bar itself, so as, in this way, to be able to provide a separately handled component. Said component can then be checked in regard to an intended function, so that it can be integrated into a manufacturing sequence in a simple way. As a result of this, the production of a battery, of a motor vehicle, or of an electrical system can be simplified substantially in basic principle.

Even though the invention has been explained on the basis of batteries or motor vehicles, it is clear to the person skilled in the art that the application of the invention is not limited to these applications. The invention can also be employed, of course, in stationary electrical systems, in particular also in the field of electrical switching systems. Here, in particular, the advantage in accordance with the invention becomes especially marked, in particular in the case when the sensor unit can be operated completely wirelessly. This is of great advantage especially in the case of electrical systems in medium-voltage and/or high-voltage applications, but also in the case of low-voltage switching systems.

The description of the exemplary embodiments serves solely for explanation of the invention and is not limited to said embodiments.

The advantages and features described for the device according to the invention and for the motor vehicle according to the invention as well as the embodiments apply equally to corresponding methods and vice versa. Consequently, method features corresponding to device features and vice versa can be provided.

The invention claimed is:

1. An electrical bus bar for conveying an electric current from a first electrical device to a second electrical device, comprising:
    a base body, which is formed from an electrically conductive material and has a first terminal for connection to the first electrical device and a second terminal for connection to the second electrical device; and
    a sensor unit with a fastening surface, which has at least one sensor element for detecting or recording a physical parameter of the bus bar, wherein the base body has a recess provided with a support surface, into which the sensor unit is depressed and fastened thereto by the fastening surface.

2. The electrical bus bar according to claim 1, wherein the sensor unit is designed to detect or record the electric current flowing through the electrical bus bar.

3. The electrical bus bar according to claim 1, wherein the sensor unit is electrically insulated with respect to the base body.

4. The electrical bus bar according to claim 1, wherein the sensor unit is electrically connected to the base body by way of a first supply terminal for supply of electrical energy for the intended operation thereof.

5. The electrical bus bar according to claim 1, wherein the sensor unit is designed for wireless supply of electrical energy for the intended operation thereof.

6. The electrical bus bar according to claim 1, wherein the sensor unit is designed to produce a wireless communications link and a communications link via the bus bar to a central unit.

7. The electrical bus bar according to claim 1, wherein the base body has a spring-elastic area between the first and second terminals.

8. The electrical bus bar according to claim 7, wherein the sensor unit is designed to detect or record a mechanical stress in the base body.

9. A battery, comprising:
at least two battery cells, wherein each of the battery cells has two electrodes that interact electrochemically with each other, wherein each of the electrodes has a terminal contact, wherein at least one terminal contact of one of the battery cells is connected to a terminal contact of the other of the battery cells by means of an electrical bus bar in an electrically conductive manner, wherein the electrical bus bar has a base body formed from an electrically conductive material, wherein the electrical bus bar has a sensor unit with a fastening surface, wherein the sensor unit has at least one sensor element for detecting or recording a physical parameter of the bus bar, wherein the base body has a recess provided with a support surface into which the sensor unit is depressed and fastened thereto by the fastening surface.

* * * * *